United States Patent
Nagafuji

[11] Patent Number: 5,944,563
[45] Date of Patent: Aug. 31, 1999

[54] PRESS-IN TERMINAL FOR A CONNECTOR

[75] Inventor: Toshiaki Nagafuji, Tokyo, Japan

[73] Assignee: NEC Corporation, Japan

[21] Appl. No.: 08/890,282

[22] Filed: Jul. 9, 1997

Related U.S. Application Data

[63] Continuation of application No. 08/520,846, Aug. 30, 1995, abandoned.

[30] Foreign Application Priority Data

Aug. 30, 1994 [JP] Japan ..................................... 6-205522

[51] Int. Cl.6 ..................................................... H01R 13/42
[52] U.S. Cl. ............................................................ 439/751
[58] Field of Search ............................... 439/751, 82, 873

[56] References Cited

U.S. PATENT DOCUMENTS 4,740,166  4/1988  Barnhouse ............................ 439/751
4,878,861  11/1989  Kendall et al. ........................... 439/82

FOREIGN PATENT DOCUMENTS 0092150  10/1983  European Pat. Off. ............... 439/751
3-17971  1/1991  Japan .

*Primary Examiner*—Neil Abrams
*Assistant Examiner*—Eugene G. Byrd
*Attorney, Agent, or Firm*—Hayes, Soloway, Hennessey, Grossman & Hage, P.C.

[57] ABSTRACT

A compliant electrical connector for press-fit connection in a plated through-hole in a printed circuit board. The connector is stamped with a notch, and has a press-in section with a trapezoidal cross-section, with the width of an upper surface with the notch being longer than that of lower surface. The connector includes a coupling section, smoothly connects the press-in section and a lead-in section, and a shoulder which assists in positioning the connector into the through-hole. The connector can be simply manufactured and miniaturized, and is suitable for use with high density printed circuits with high density, and compliance can be guaranteed even in a case where the inner diameter of the through-hole is small.

11 Claims, 11 Drawing Sheets

(E-E CROSS-SECTION)

(IN THROUGH-HOLE)

- 8 CONTACTING SECTION
- 5a SHOULDER
- 3a COUPLING SECTION
- 2a PRESS-IN SECTION
- 3a COUPLING SECTION
- 32 NON-PRESS-IN SECTION (F-F CROSS-SECTION)

(G-G CROSS-SECTION)

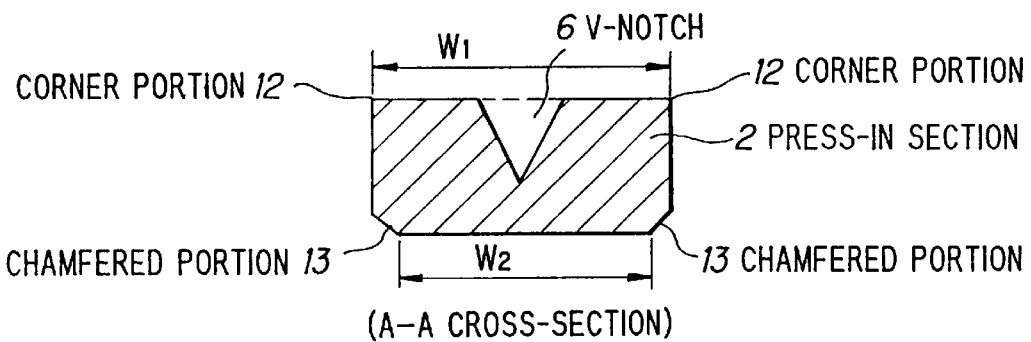
FIG.6A (A-A CROSS-SECTION)
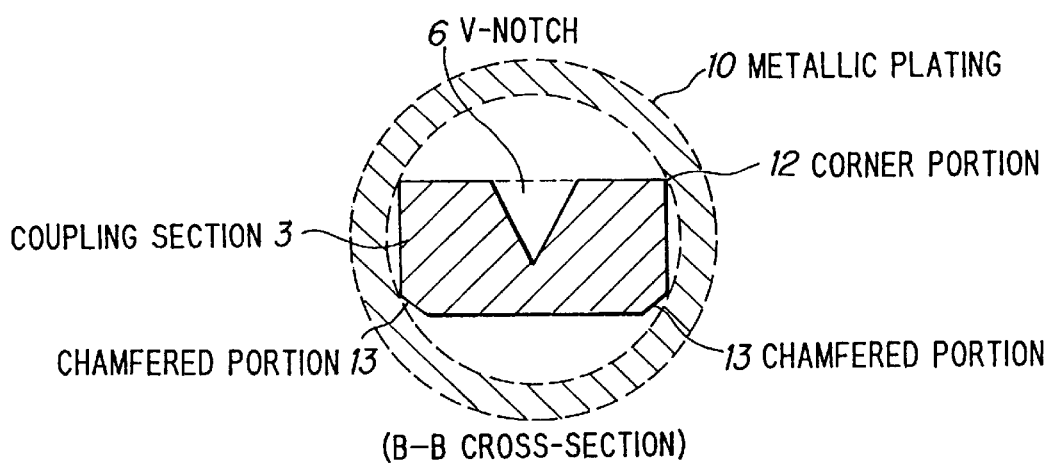
FIG.6B (B-B CROSS-SECTION)
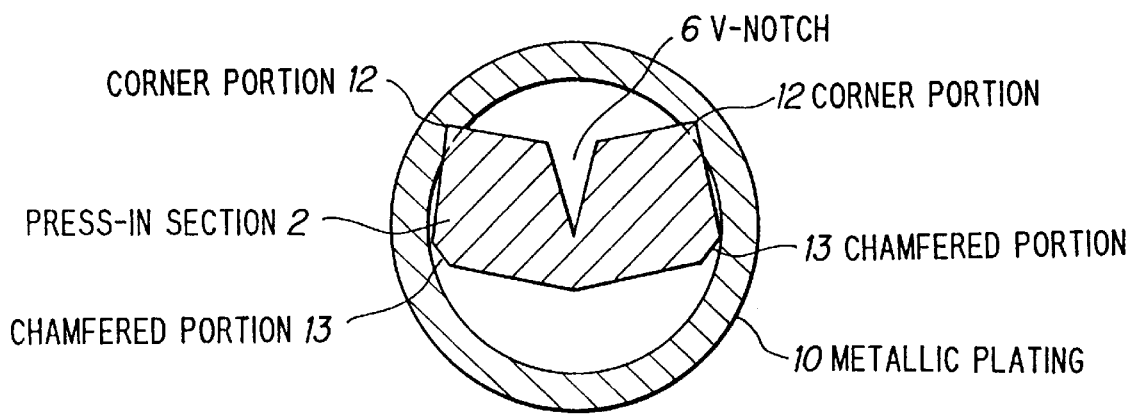
FIG.6C

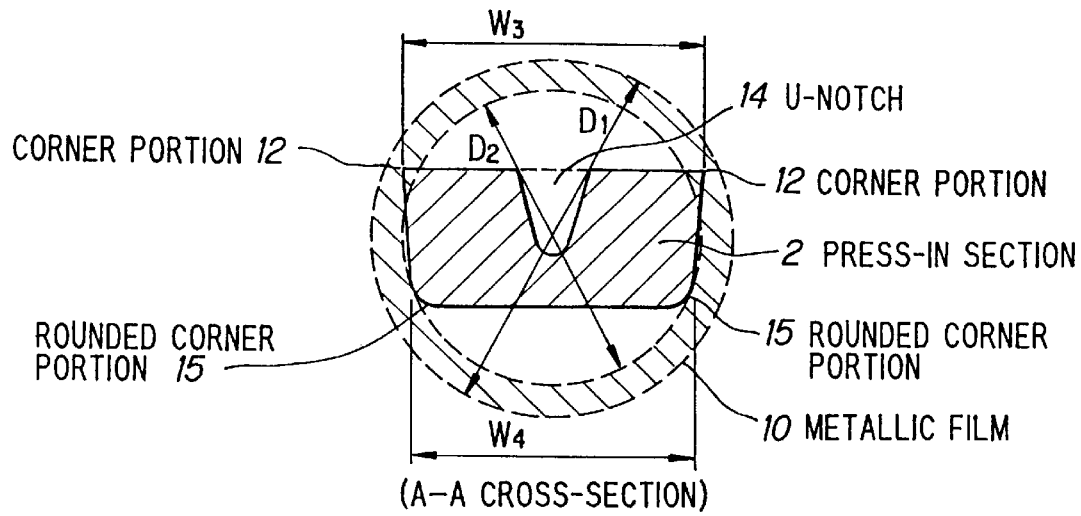
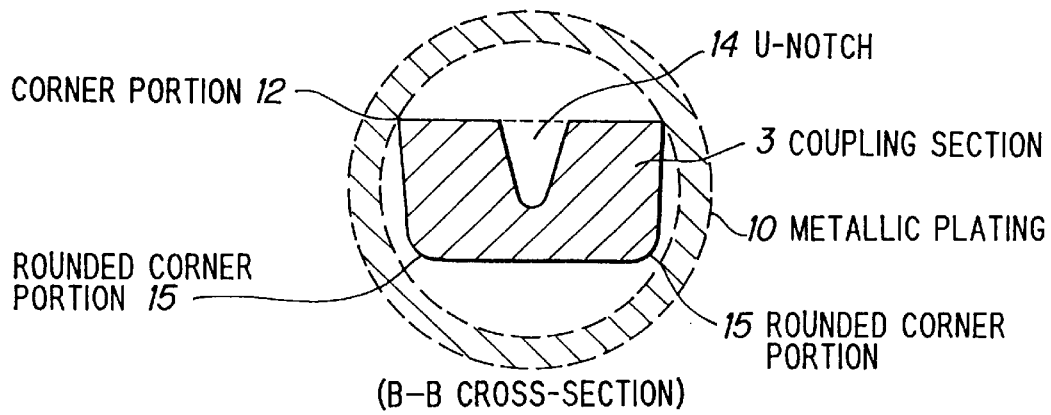
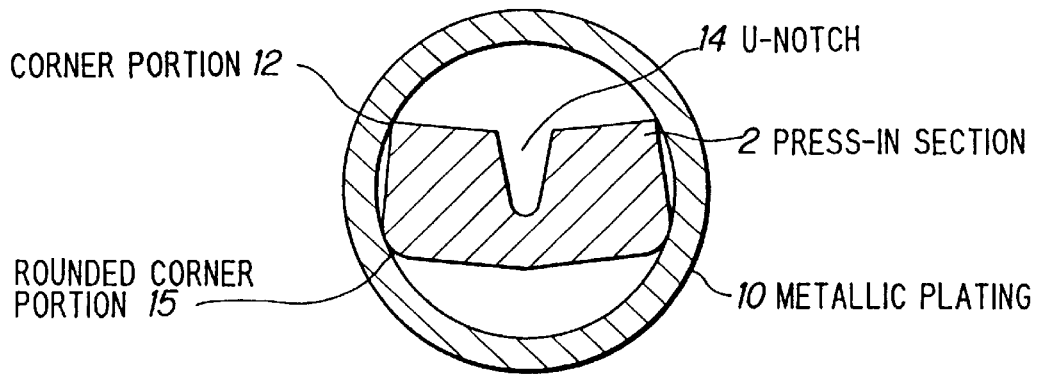

(C—C CROSS-SECTION)

- 6 V-NOTCH
- 17a SECOND CHAMFERED PORTION
- 2 PRESS-IN SECTION
- 16 FIRST CHAMFERED PORTION (D—D CROSS-SECTION)

- 6 V-NOTCH
- 17b SECOND CHAMFERED PORTION
- 3 COUPLING SECTION
- 16 FIRST CHAMFERED PORTION

- 6 V-NOTCH
- 17 SECOND CHAMFERED PORTION
- 3 COUPLING SECTION
- 16 FIRST CHAMFERED PORTION

- 10 METALLIC FILM
- 6 FIRST V-NOTCH
- 2 PRESS-IN PORTION
- 15 ROUNDED CORNER
- 18 SECOND V-NOTCH

- 2 PRESS-IN SECTION
- 19 FLAG
- DIRECTION OF STAMPING

- 6 NOTCH
- 2 PRESS-IN PORTION

20 MALE HOUSING

21 MALE PRESS-IN TERMINAL

22 MALE CONTACTER
SHOULDER 5
NOTCH 6
LEAD-IN SECTION 4
2 PRESS-IN SECTION
3 COUPLING SECTION

PRESS-IN TERMINAL FOR A CONNECTOR

This is a continuation of application Ser. No. 08/520,846 filed on Aug. 30, 1995 abandoned.

FIELD OF THE INVENTION

The invention relates to a press-in terminal used in a connector and especially to a press-in terminal which is pressed into a through-hole of a printed circuit board, mechanically held therein, and brought into electrically contact with the metallic plating formed on the inner periphery of the through-hole.

BACKGROUND OF THE INVENTION

A press-in terminal for a connector is an important means for connecting with a printed circuit formed on a circuit board at a desired through-hole, and plays important roles in a connector which combines plural printed circuits. The press-in terminal should have excellent compliance, and be adapted for use with any through-hole, even if inner diameters of the through-holes are unequal. When pressed into the through-hole, the press-in terminal should electrically contact with a metallic plating formed on a inner surface of the through-hole and be mechanically held therein. Moreover, miniaturization of the press-in terminal is extremely desirable, for constructing the printed circuit with high density. On the other hand, the press-in terminal is required to have sufficient mechanical strength, for safety in manufacture and use.

Every effort has been made to improve the structure and the manufacturing process of the press-in terminal, and improvements have been achieved to some extent. However, even at present, a press-in terminal with excellent characteristics is hard to manufacture, and further investigations into the aforementioned problems are necessary.

SUMMARY OF THE INVENTION

Accordingly, it is an object of the invention to provide a press-in terminal for a connector, which has a simple structure, an excellent compliance and small lateral dimension, and which does not significantly damage the metallic plating on the inner periphery of the through-hole.

According to the feature of the invention, a press-in terminal for a connector, which is pressed into a through-hole being made on a printed circuit board and having a metallic plating on an inner surface of the through-hole, and electrically contacts with the metallic plating, comprises:

- a press-in section which is stamped with a V or U-shaped notch in a direction perpendicular to a surface of a conducting plate, wherein the width of the surface with the notch (the first surface, hereinafter) is larger than that of a surface, which is opposite to the first surface (the second surface, hereinafter);
- a lead-in section, a diagonal dimension of which is smaller than an inner diameter of the through-hole;
- a coupling section, which is stamped with the V or U-shaped notch, and a diagonal dimension of which gradually increases from the lead-in section to the press-in section, and a surface of which is smoothly formed; and
- a shoulder, which is formed in a region higher than the press-in section and has a larger width as compared with that of the press-in section.

BRIEF DESCRIPTION OF THE DRAWINGS

The invention will be explained in more detail in conjunction with appended drawings, wherein:

FIG. 6C shows the cross-sectional view of the press-in section, when it is pressed into a through-hole, FIGS. 7A–7B respectively show the cross-sectional views of the press-in and coupling sections of a press-in terminal according to the invention, which are shown as the second preferred embodiment of the invention, FIG. 7C shows the cross-sectional view of the press-in section, when pressed into a through-hole, FIGS. 8A–8B respectively show the front and bottom views of the press-in terminal according the invention, which are shown as the third preferred embodiment of the invention, FIGS. 9A–9B respectively show the cross-sectional views of press-in and coupling sections of the press-in terminal shown in FIGS. 8A–8B.

DESCRIPTION OF THE PREFERRED EMBODIMENTS

Before explaining preferred embodiments according to the invention, the aforementioned conventional press-in terminal will be explained.

Various kinds of press-in terminals used in connectors and etc., are known, and some of them will be explained referring to FIGS. 1, 2a, 2b, 3a–3c, and 4a–4d.

Figure 1:
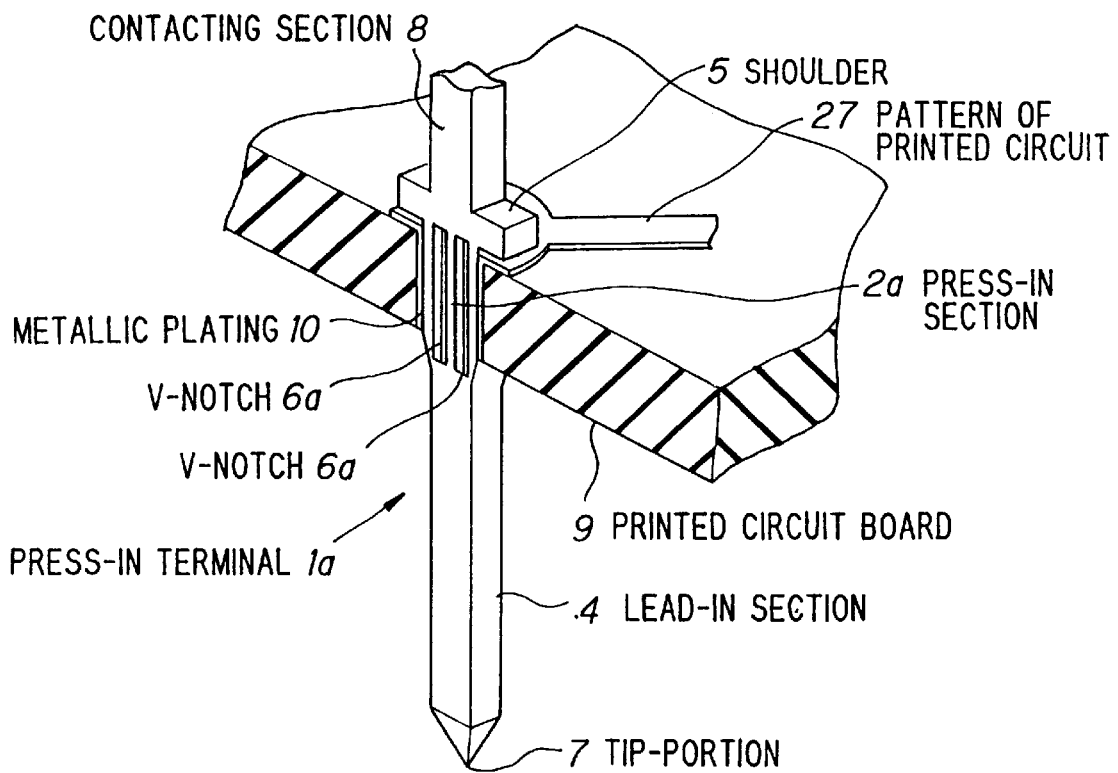
FIG. 1 shows a perspective view, showing a conventional press-in terminal pressed into a through-hole of a printed circuit board, FIGS. 2A–2B respectively show cross-sectional views of a press-in section of a conventional press-in terminal shown in FIG. 1 before and after being pressed into the through-hole.

FIG. 1 is a perspective drawing of an example of a conventional press-in terminal, which is fitted in a printed circuit board. As shown in FIG. 1, the conventional press-in terminal 1a comprises a press-in section 2a, on which two parallel V-notches are formed, a lead-in section 4, which is connected to the press-in section 2a, a tip portion 7, a shoulder 5, which is connected to the press-in section 2a and a contacting section 8. When the press-in terminal 1a with the aforementioned structure is pressed into a through-hole of a printed circuit board 9, two beams on both sides of the press-in section 2a are deformed, and contact with a metallic plating 10 formed on a inner periphery of the through-hole. The way of pressing-in is so-called compliant pressing-in. Moreover, reference numeral 27 is a pattern on the printed circuit board which is connected to the press-in section 2a.

Figure 2A:
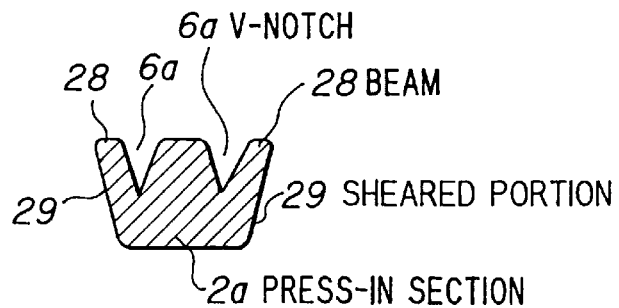
Figure 2B:
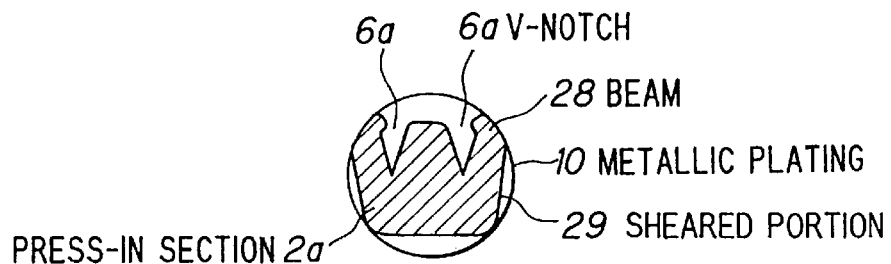

FIGS. 2A and 2B respectively show cross-sectional views of the press-in section 2a shown in FIG. 1, before and after it is pressed into the through-hole. As shown in FIG. 2A, before being pressed into the through-hole, the cross-section of press-in portion 2a has a crown-like shape, and beams 28 and sheared portions 29 are formed at the both ends of the press-in section 2a. Next, as shown in FIG. 2B, when the press-in section 2a is pressed into the through-hole, the both beams 28 are bent and brought into contact with the metallic plating 10. The beams 28 are formed by two notches 6a at both ends and large sheared portion 29. The aforementioned structure is disclosed in detail in Japanese Patent Kokai No. 3-17971.

Figure 3A:
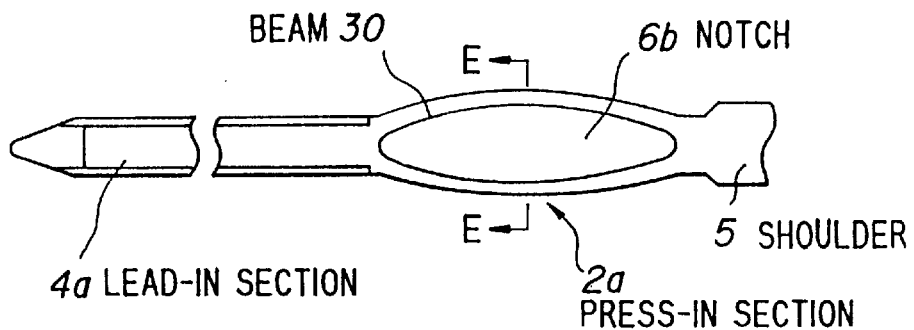
FIG. 3A shows a front view of another conventional press-in terminal, and FIGS. 3B–3C respectively show cross-sectional views of the press-in section of the conventional press-in terminal shown in FIG. 3A before and after being pressed into a through-hole.
Figure 3B:
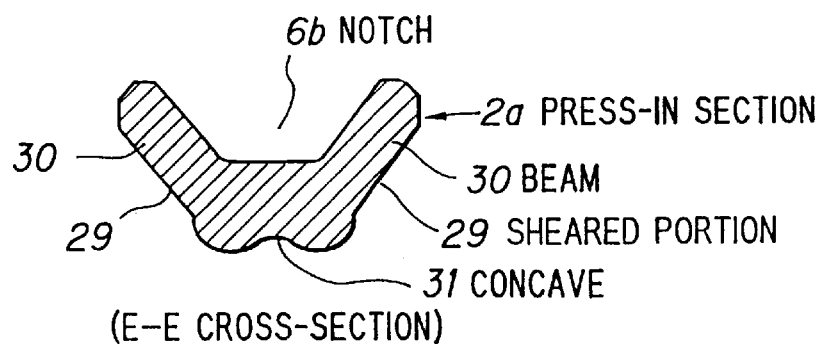
Figure 3C:
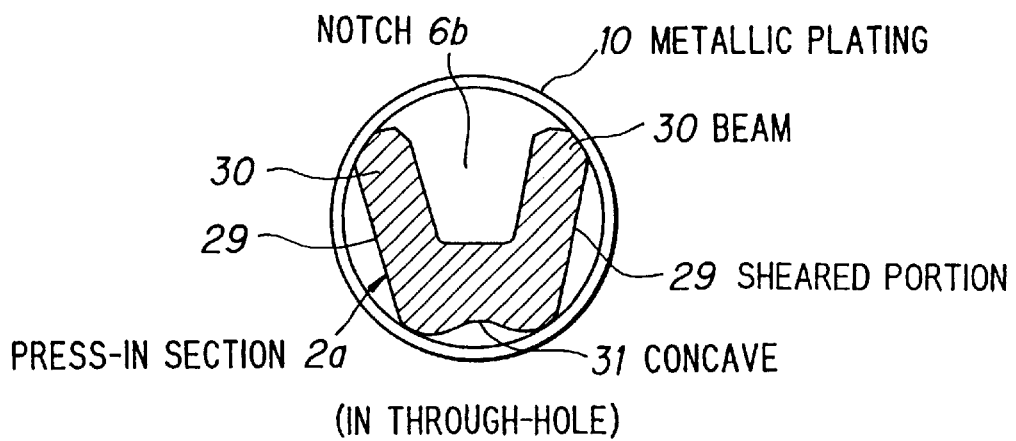

FIGS. 3A–3C are drawings for explanation of another example of a press-in terminal. FIG. 3A is the front view of the press-in terminal. FIGS. 3B–3C respectively show the cross-sectional views of the press-in terminal in the E-E cross sections, before and after the press-in terminal is pressed into a through-hole. As shown in FIG. 3A, such a press-in terminal comprises a press-in section 2a, which has arm-portions 30 on its both sides and a notch 6b, a bar-shaped lead-in section 4a and a shoulder 5. Moreover, as shown in FIG. 3B, the cross-section of the press-in section 2a in a E-E cross-section is nearly V-shaped, and has large sheared portions 29 on the both sides, being similar to the aforementioned crown-shaped one. Then, the trapezoidal notch 6b is formed along the center line (not shown), and thereby beams 30 are formed along both sides of the press-in section 2a. The terminal has a concave portion 31 at its under surface. When the press-in terminal with the press-in section 2a is pressed into the through-hole, the beams 30 are bent and touch a metallic plating 10, as shown in FIG. 3C. The above mentioned descriptions have been disclosed in Japanese Patent Kokai 63-54273.

When manufacturing the two aforementioned examples, the deformation of the metal at the time of stamping plays important roles.

Figure 4A:
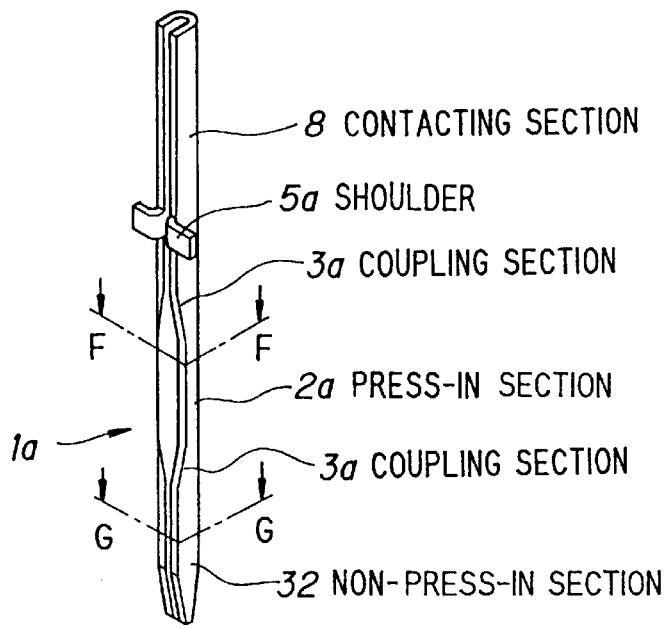
FIG. 4A shows a perspective view of another conventional press-in terminal, and FIG. 4B and 4D respectively show cross-sectional views of said conventional press-in terminal in F-F and G-G cross-sections shown in FIG. 4A.
Figure 4B:
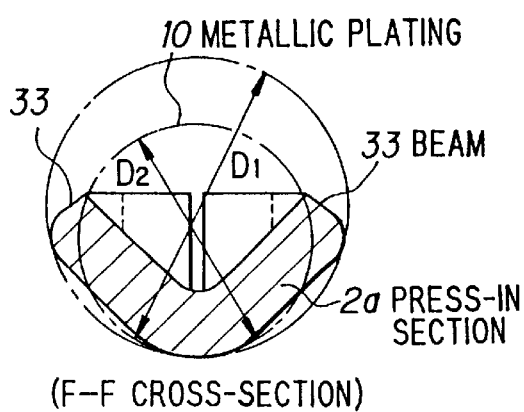
FIG. 4C shows an enlarged cross-sectional view of the press-in section when pressed into a through-hole.
Figure 4C:
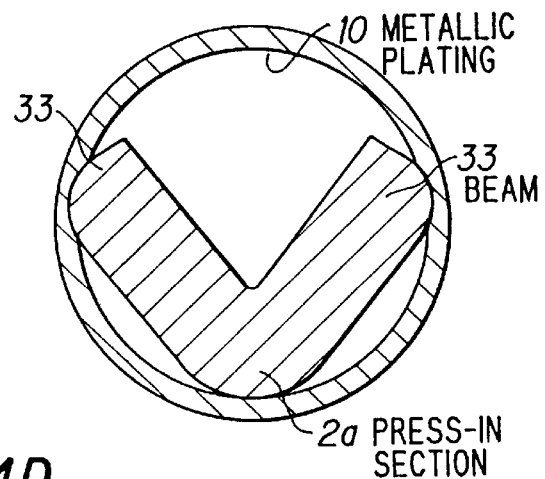
Figure 4D:
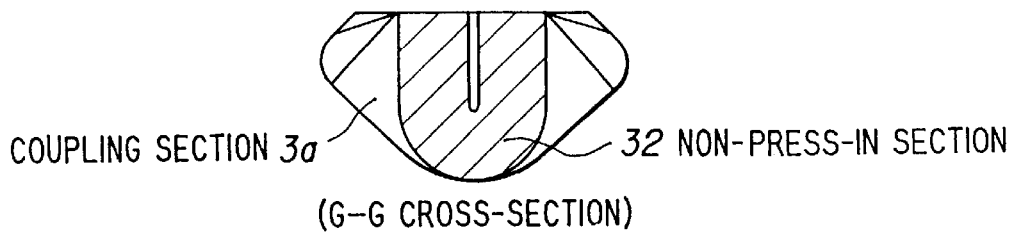

FIG. 4A shows a perspective view of another structure of a conventional press-in terminal. As seen in FIG. 4A, the process of manufacturing the press-in terminal is as follows. A press-in section 2a is formed by bending metallic plate such that the cross-section of the metallic plate becomes V-shaped. On the other hand, the cross-section of non-press-in section 32, which is separate from a coupling section 3a, and a contacting section 8, which is separate from a shoulder 5a, are U-shaped. Since the press-in terminal 1a has two coupling sections 3a, in which the shapes of their cross-sections are varied gradually from V to U, the non-press-in section 32 with a U-shaped cross-section and the press-in portion 2a with a V-shaped cross-section can be smoothly connected via the coupling section 3a. As shown in FIG. 4B, which shows a cross-sectional view of the press-in section 2a in a F-F cross-section, the aforementioned cross-section is V-shaped, and its diagonal dimension $D_1$ is far larger than the inner diameter $D_2$ of the metallic plating 10 formed in a through-hole. Further, as shown in FIG. 4D, which is a cross-sectional view of the non-press-in portion 32 in a G-G cross-section, the non-press-in section 32 and a contacting section 8 are so bent that their cross-sections become U-shaped, and their diagonal dimensions are so small that they never touch the through-hole. Still more, as shown in FIG. 4C, which represents the enlarged cross-sectional view of the press-in portion 2a, the beams on the both sides are bent, and a V-shaped corner angle decreases, when pressed into the through-hole. The above mentioned descriptions are shown in more detail in Japanese Utility Model Kokai No. 3-39891.

The disadvantage of the conventional press-in terminal, in which the press-in section is formed by stamping, is that its configuration is too complicated. In ordinary cases, the terminal is stamped in a progressive stamping machine, and must go through various processes in the progressive stamping machine.

In the case of the first and second press-in terminals, which have been explained as examples of conventional press-in terminals, since they have large sheared portions, satisfactory accuracies cannot be obtained by a simple progressive stamping machine, and high accuracy of the stamping machine is required. Moreover, it is difficult to manufacture punches and dies with high accuracies used in said stamping machine, especially when the sizes of products are small, and careful maintenance of the manufacturing apparatus is required. As a matter of course, there is the problem that a semimanufactured terminal, which has been treated in a progressive stamping machine, cannot be shaped into the press-in terminal in a later process. Further, the press-in section of the conventional press-in terminal has arm portions on its both sides, which are bent to make electrical contacts with the inner surface of the cylindrical metallic plating, when pressed into the through-hole. Thus, the arms should have sufficient lengths, so that the conventional configuration is not suitable for miniaturization of the press-in terminal.

Still more, in a case where a metallic plate is bent into V-shape for forming a press-in terminal, a sufficiently broad width of metallic plate is necessary. Thus, miniaturization of the terminal is difficult, and circuit structure with high density cannot be realized, using connectors containing the above mentioned press-in terminal.

For example, as shown in FIG. 4C as the third example of conventional press-in terminal, the board width of the metallic plate is required as compared with the thickness. Finally, miniaturization of the press-in terminal cannot be achieved, and even if a V-shaped configuration can be obtained, the press-in section is solidified, does not bend and seriously damages the through-hole.

Figure 5:
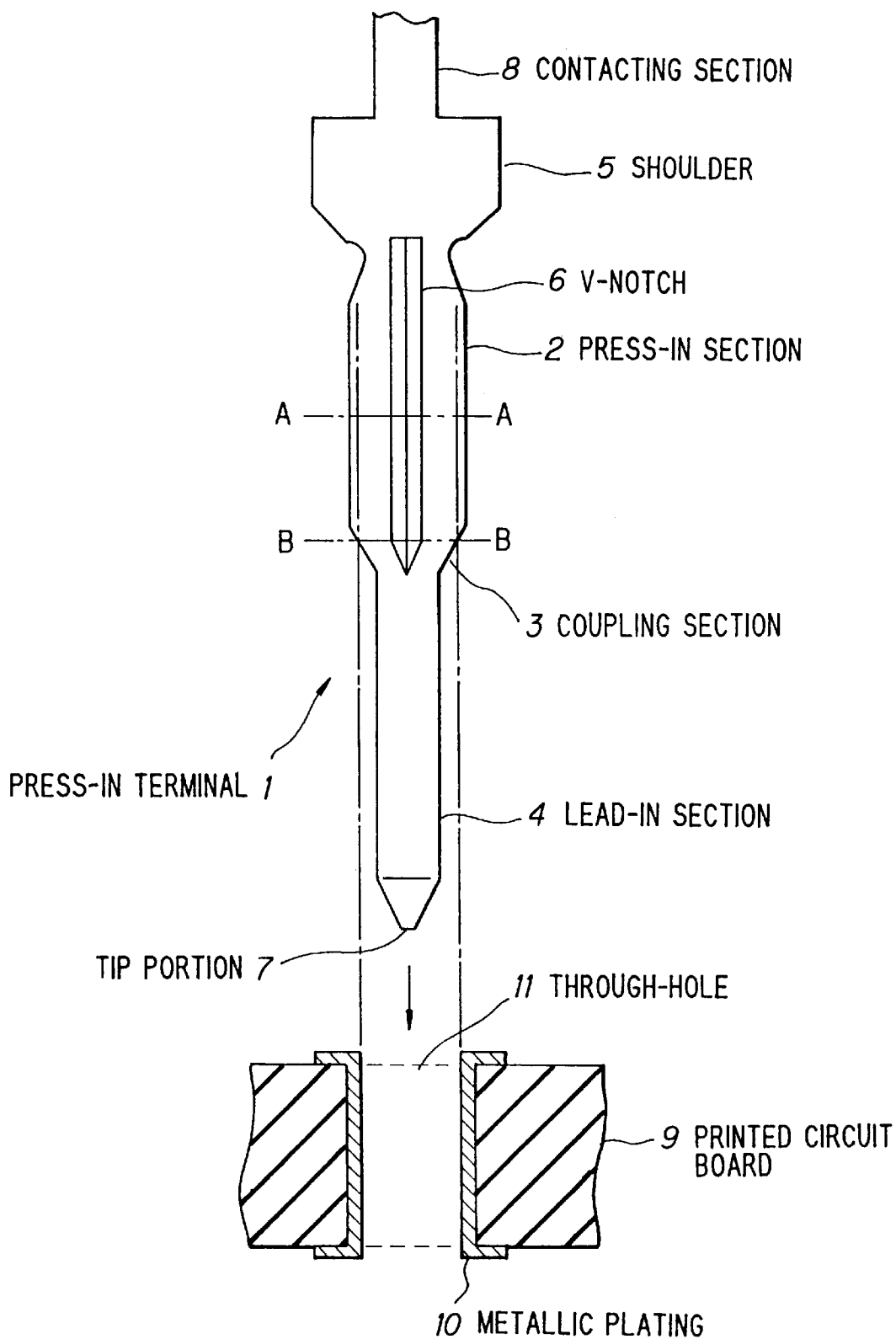
FIG. 5 shows a front view of a press-in terminal according to the invention as the first preferred embodiment, FIGS. 6A–6B respectively show cross-sectional views of the press-in section and coupling sections of the press-in terminal shown in FIG. 5.

FIG. 5 shows the front view of the first preferred embodiment of the invention. As seen from FIG. 5, this press-in terminal 1 comprises a press-in section 2, which is pressed into a through-hole 11 with a metallic-plating 10 serving as an inner surface thereof and is caught and held therein, a lead-in section 4, which involves a tip-portion 7, and is led into the through-hole 11 first of all, a coupling section 3, which smoothly connects the lead-in section 4 and the press-in section 2, a shoulder 5, to which jigs are touched for applying a force to press the press-in section 2 into the through-hole 11, and a contacting section 8, which is connected to the shoulder 5. Moreover, the width of the press-in section 2 is larger than the inner diameter of the through-hole 11 with the metallic plating on its inner surface, and a V-notch 6 is formed along the center line of the press-in section 2 and in the direction perpendicular to the surface of the conducting plane.

The press-in terminal 1 is made of a compliant metallic material, such as phosphor bronze, beryllium copper or brass, and the V-notch 6 and chamfered portions 13, which are formed on the opposite side to the one with the V-notch 6, are formed by a stamping process using dies and punches. The surfaces of these products may be plated by metals, such as nickel, solder, tin or gold.

The V-notch 6 thus obtained is narrow on the coupling section 3 and shallow near its end portion. The reason why the V-notch 6 is narrow is that, the width of the coupling section 3 is narrow, and so when a force acts on the lead-in section 4, the press-in terminal 1 may be easily broken at the coupling section 3, if not so. In order to prevent the press-in terminal 1 from being broken in the stamping process, the V-notch 6 is shallow.

FIG. 6A–6B respectively show the cross-sections of the press-in section 2 and the through-hole shown in FIG. 5. FIG. 6C is the cross-sectional view of the press-in section 2 and the through-hole 11, when the former is pressed into the latter. As shown in FIG. 6A, the cross-section of the press-in section 2 viewed in the A-A cross-section is provided with the V-notch 6 near the center line of the upper surface thereof, and has a larger width $W_1$ as compared with the inner diameter of the through-hole 11. The corners at both edges of the surface, which is opposite to the one with the V-notch 6, are chamfered, wherein the chamfered portions are denoted by 13. The width $W_2$ of the lower surface, which is opposite to the surface with the V-notch 6, is substantially smaller than $W_1$, the width of the upper surface.

As shown in FIG. 6B, the cross-section of the coupling section 3, viewed in a B-B cross-section in FIG. 5, is provided with the V-notch 6 and the chamfered portions 13, which are extended from the press-in section 2. In the situation shown in FIG. 6B, the press-in terminal 1 firstly contacts with the through-hole 11, when the former is pressed into the latter. It is most desirable that the press-in terminal 1 contacts with the metallic plating 10 of the through-hole 11 near the middle point of the coupling section 3. When the press-in terminal 1 is further pressed into the through-hole 11, both corner portions 12 come close to each other, and the press-in section 2 reaches the through-hole 11.

Moreover, when the press-in section 2 is perfectly pressed into the through-hole 11 as shown in FIG. 6C, since the diagonal dimension of the press-in terminal 1 is gradually increased from the lead-in section 4 to the press-in section 2 via the coupling section 3, the forces acting on the corner portions 12 are increased smoothly, and then, the press-in section 2 is bent into V-shape in the direction of the depth thereof. Then, the chamfered portions 13 are positioned on the opposite side of that of the corner portions 12, and therefore, larger forces arise at the corner portions 12, as compared with those at the chamfered portions 13.

As seen from the above descriptions, even if there is nonuniformity in the diameters of through-holes to some extent, the press-in section 2 is bent in larger or smaller scale and adapts to the particular situation, and thus a press-in terminal 1 with high compliance can be obtained. In such cases, it should be noted that, the compliance and flexibility of the press-in terminal 1 are largely affected by the depth of the V-notch 6, and the determination of this dimension, which satisfies desired conditions, is very important. By controlling the depth of the V-notch 6, the characteristics of the press-in terminal 1 can be controlled, manufacturing of the press-in terminal is made possible, and maintenance of the manufacturing equipment is made easy.

FIGS. 7A–7C are drawings for explaining the second preferred embodiment of the invention. FIG. 7A and FIG. 7B respectively show the cross-sectional views of a press-in section 2 and a coupling section 3. FIG. 7C shows a cross-sectional view of the press-in section 2 which is pressed into the through-hole 11. As seen from FIG. 7A and FIG. 6A, the fundamental structure of the second preferred embodiment is similar to that of the aforementioned first preferred embodiment. However, the difference between the first and second embodiments is as follows. In order to prolong the life of a punch, which stamps out a notch, a U-notch 14 is adopted by rounding off the sharp edge of the V-notch 6, and corner portions at both edges of a lower surface are rounded off, wherein these portions are denoted by 15. Besides, when the cross-section of the press-in section 2 is rectangular, when a U-notch is stamped on a upper-surface of the press-in section 2, slight extentions arise in widths of the upper and lower surfaces, and the width of the upper surface becomes larger than that of the lower surface. In other words, $W_3 > W_4$ as shown in FIG. 7A.

When a conducting plate serving as a material is stamped by an ordinary progressive stamping machine, the press-in section 2 can be manufactured without slight extensions. However, when a U-notch is stamped on a material, which has been processed by using a punch and a die, the slight extensions of the widths are inevitable. The aforementioned slight extensions of the widths of the press-in section 2 are advantageous from the view point of increasing forces of the corner portions 12 acting on the metallic plating 10 of the through-hole 11. Moreover, the rounded portions 15 can be manufactured by using flags of the stamping process. In the embodiment shown in FIGS. 7A–7C, the diagonal dimension $D_1$ of the press-in section 2 is larger than the inner diameter $D_2$ of the through-hole 11. Still more, in order to further prolong the life of the U-shaped punch, it is profitable to round off the base of the U-shaped punch.

As shown in FIG. 7B, the coupling section 3, which is connected to the press-in section 2, is provided with the U-notch similarly to the case of the press-in section 2 (FIG. 7A), and thereby the width of the upper-surface becomes larger than that of the lower surface. Accordingly, the slight extensions of the press-in and coupling sections should be taken into account in design.

Next, as shown in FIG. 7C, the press-in section 2 is pressed into the through-hole 11, contacts with the metallic plating 10, and is bent into a V-shape, where its four corners touch the metallic plating 10.

For example, in the press-in section 2 of an actually manufactured press-in terminal, the width is 1 mm, the thickness is 0.3 mm, and the depth is 0.25 mm. If such a small terminal is actually manufactured, it is pressed into a through-hole 11 with an inner diameter of 0.66 mm made on a circuit board, which is made of glass-fiber-reinforced epoxy-resin. But, the rounded corners 15 may not touch the metallic plating 10. Conversely, if the press-in section 2 is pressed into a through-hole with a smaller diameter than that shown in FIG. 7C, the bending of the press-in section 2 becomes sharp and the opening of the U-notch 14 becomes narrower. Moreover, the press-in section 2 can cope with the case where the inner diameter of the through-hole is less than 0.66 mm, for example, is 0.4 mm or 0.35 mm, by thinning the depth of the press-in section 2, and thereby implementation with higher density becomes possible.

Figure 8A:
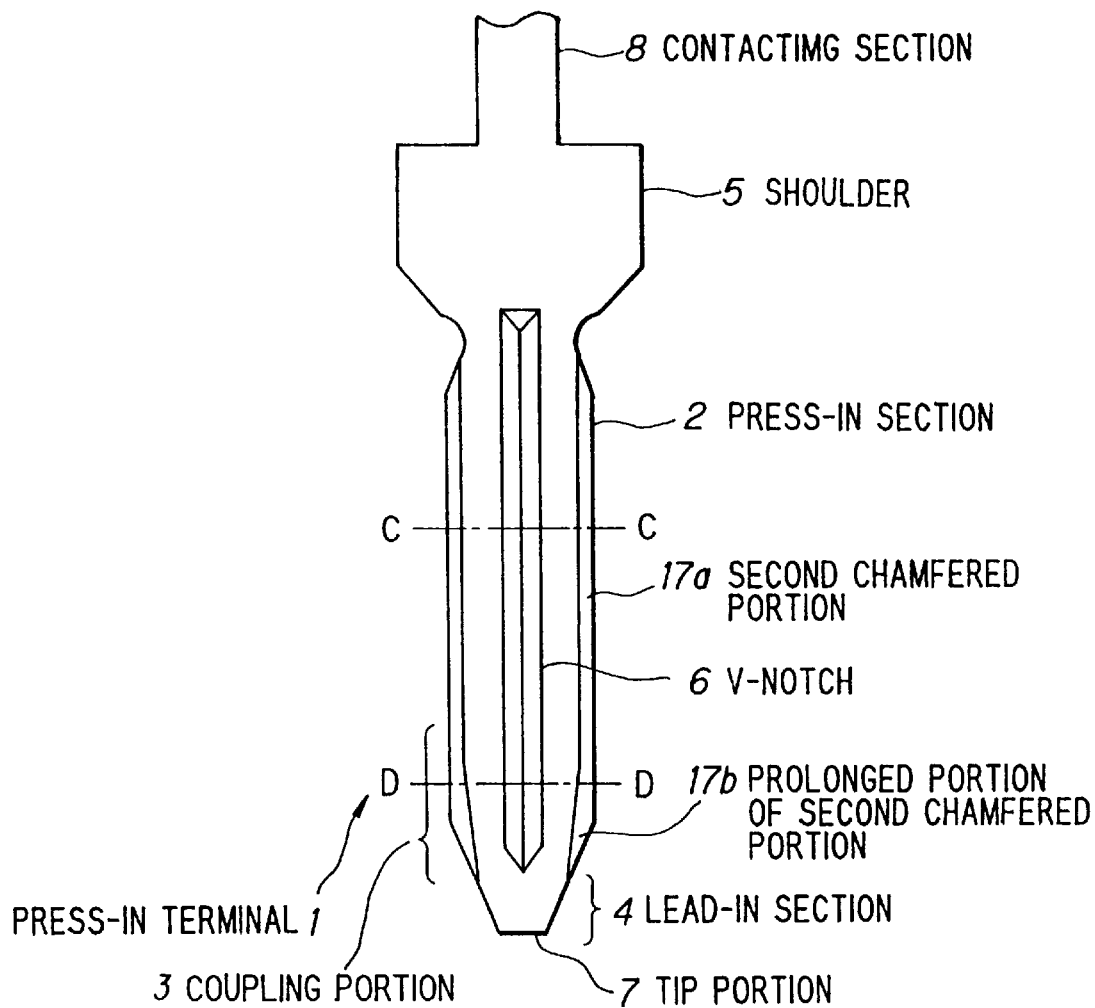
Figure 8B:
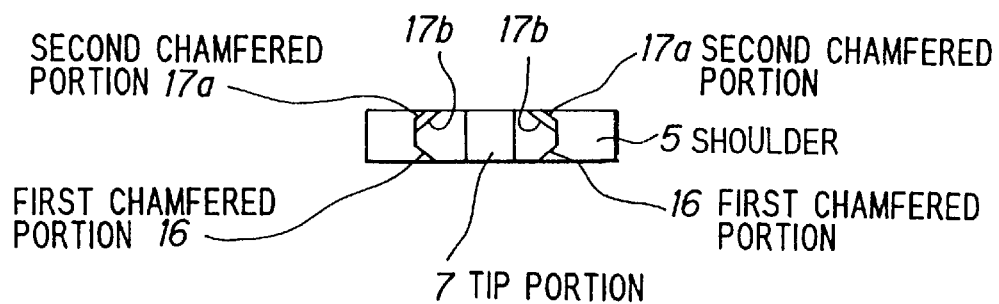

FIGS. 8A and 8B respectively show the front and bottom views of the third preferred embodiment of the invention. On comparing FIGS. 8A–8B with FIG. 5, which shows the first preferred embodiment of the invention, it can be seen that, in the third preferred embodiment, lead-in section 4 becomes shorter, and chamfered portions 16 and 17 are formed along the both sides of press-in section 2 and coupling section 3. The first chamfered portions 16 are formed along both ends of the lower surface of the press-in terminal 1, while the second chamfered portions 17 are formed on the upper surface. The second chamfered portions 17 are divided into two areas, 17a and 17b, where 17a is on the press-in section 2, and 17b is the remaining area of portions 17. On the coupling section 3, the width of the second chamfered portion 17b gradually increases as the observation point is closer to the lead-in section 4, except in a triangular area near the lowest point of the second chamfered portion 17b. In other words, the width of the second chamfered portion 17b decreases, as the observation point moves from the lead-in section 4 to the press-in section 2, except in the triangular area near the lowest point of the second chamfered portion 17b. Although a structure in which the width of the first chamfered portion 16 on the lower surface is expressed as a decreasing function from the lead-in section 4 to the press-in section 2 can be adopted, there is no serious problem in the structure shown in FIGS. 8A–8B.

Figure 9A:
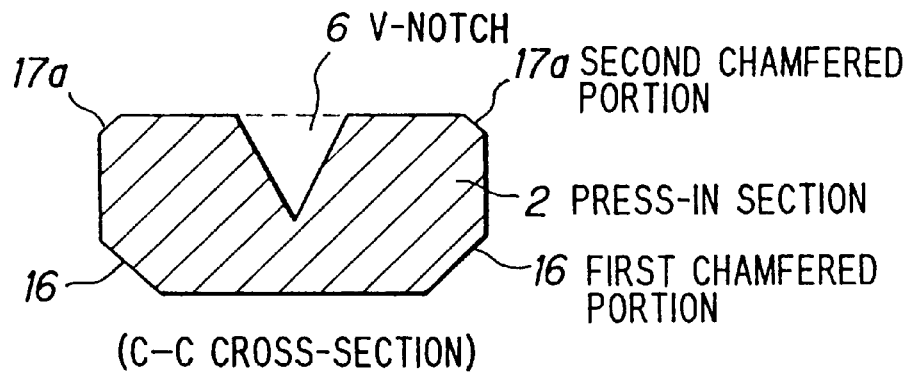
Figure 9B:
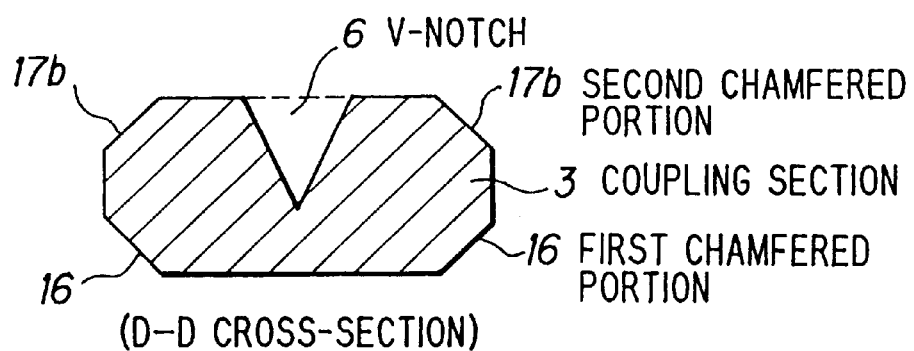

FIGS. 9A–9B respectively show the cross-sectional views of the press-in section 2 and the coupling section 3, both of which are shown in FIGS. 8A–8B. As shown in FIG. 9A, which is the cross-sectional view in a C-C cross-section, the press-in section 2 is provided with the first chamfered portions 16 and the second chamfered portions 17a, and the latter portions are smaller than the former portions, and therefore the press-in section 2 can be easily bent into a V-shape. That is to say, the inventor notices the fact that the second chamfered portions hardly damaged the metallic-plating 10 in the through-hole 11, because the surfaces are easily bent inside.

As shown in FIG. 9B, which is a cross-sectional view in a D-D cross-section, the coupling section 3 is provided with the first chamfered portions 16 on its lower surface, and the second chamfered portions 17b, which are extended from portions 17a, on its upper surface, and thereby the diagonal dimension on the coupling section 3 can be reduced. The coupling section 3 does not strongly contact with the inner surface of the through-hole 11, but lightly touches said inner surface. In the situation shown in FIG. 9B, the press-in section 2 has begun to be led to the portion where it really contacts with the inner surface of the through-hole 11 and the coupling section 3 is in a lead-in situation for the press-in section 2, which makes the press-in section 2 smoothly bend into a V-shape. The action of the coupling section 3 mentioned in the above is similar to that shown in FIG. 5. If there is not such lead-in situation for the press-in section 2, the press-in section 2 may damage the metallic plating (not shown) in the through-hole 11, and is hardly bent into a V-shape.

Figure 10:
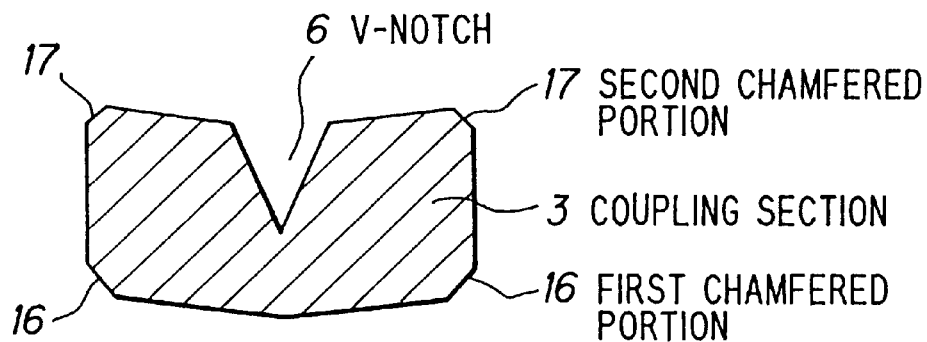
FIG. 10 shows a cross-sectional view of a coupling section of a press-in terminal, which is shown as the fourth preferred embodiment of the invention.

FIG. 10 is a cross-sectional view of a coupling section for explaining the fourth preferred embodiment of the invention on the press-in terminal. As shown in FIG. 10, the coupling section 3, which is previously formed into a V-shape, is adopted, instead of the coupling section shown in FIGS. 8A–9D. In this structure, the coupling section 3 serves as the preparative leading region for the press-in section 2, and thereby the press-in section is smoothly bent into a V-shape, and the same effect as that in the case of FIG. 8A can be obtained. In this embodiment, the widths of chamfered portions 17 on both ends of the surface with the V-notch may be nearly the same as those of the press-in section. Moreover, the press-in section 2 (not shown in FIG. 10) is previously formed so that its cross-section is V-shaped similar to that of the coupling section 3 shown in FIG. 10.

Figure 11:
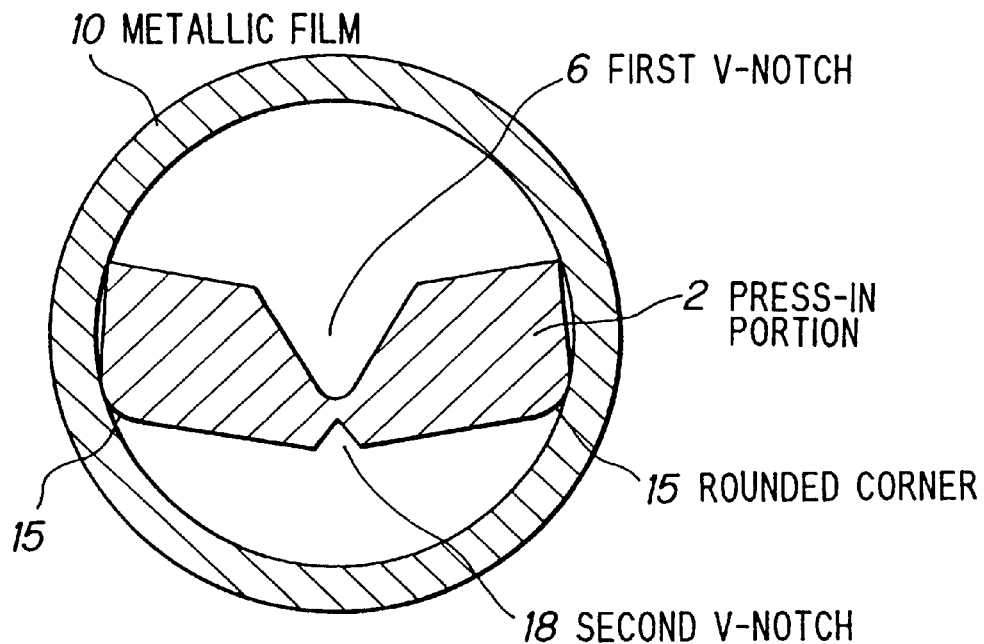
FIG. 11 shows a cross-sectional view of a press-in section pressed into a through-hole, which is shown as the fifth preferred embodiment of the invention.

FIG. 11 is a cross-sectional view showing the situation that a press-in section 2 is pressed into a through-hole 11, for explaining the fifth preferred embodiment of the invention. As shown in FIG. 11, the small second V-notch 18 is formed on the opposite side of the first V-notch 6, which has played important roles in the previous embodiments. The corners at the both ends of the lower surface are rounded off, and the rounded corners thus obtained are denoted by 15. The press-in section 2 becomes more flexible by the second V-notch 18, and when the press-in terminal 1 is pressed into the through-hole 1, the press-in section 2 is easily bent into a V-shape. A further advantage of this structure is that, in stamping out the press-in terminals, the lives of the punch and the die become short, when the press-in terminal is stamped on only one side thereof, while their lives can be prolonged when the press-in terminal is stamped on both sides.

The first–fifth embodiments have been explained in the above. However, a press-in terminal, in which not all corners are rounded or chamfered, can be expected to obtain similar effects. Of course, in such a structure, the metallic plating is likely to be damaged, but state of electrical contacts may be guaranteed by amending the condition of through-hole, for example by increasing the thickness of the metallic plating on an inner surface of the through-hole. Especially when rounding off or chamfering is difficult, the aforementioned way is profitable.

Figure 12A:
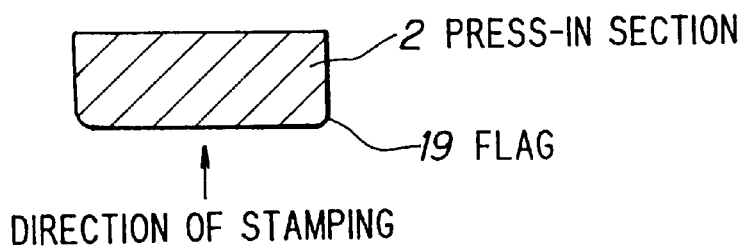
FIGS. 12A–12B are cross-sectional views showing steps according to one preferred embodiment of a method according to the present invention for manufacturing a press-in terminal.
Figure 12B:
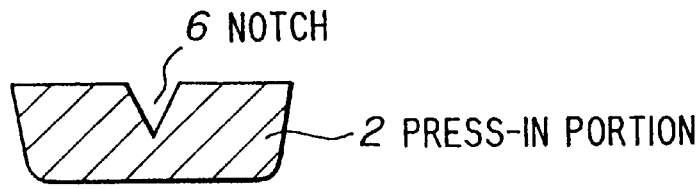

FIGS. 12A–12B are cross-sectional views showing the process of manufacturing a press-in terminal according to one preferred embodiment of the invention. As shown in FIG. 12A, in the manufacturing process of a press-in terminal shown in FIGS. 7A–7C and etc., sections of an electrically conducting plate, which respectively correspond to a press-in section 2, a lead-in section 4 and a coupling section 3, are stamped in a pre-determined direction using punches and dies. In such a case, flags 19 arise, which correspond to rounded portions 15 shown in FIGS. 7A–7C. Next, as shown in FIG. 12B, a V-notch 6 is formed by stamping the press-in section 2 and the coupling section 3, which have been already processed in the previous step shown in FIG. 12A, in the direction opposite to that shown in FIG. 12A along the central axis of the press-in terminal. Then, the press-in section 2 is slightly extended, and its cross-section becomes trapezoidal. Still more, if hardening occurs in a step of stamping a V-notch, it is effective if heat treatment is applied only to the press-in section 2 and its hardness is previously decreased.

Moreover, electrically conducting plastics or metal plated plastic may be used as the material serving as the electric conductor.

Figure 13A:
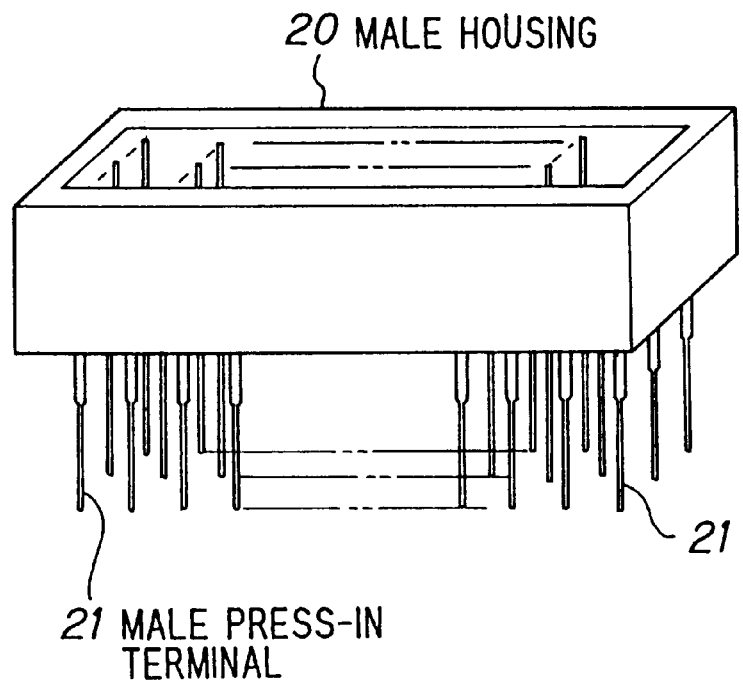
FIGS. 13A–13B show perspective views, which respectively show a male connector and a male press-in terminal used therein.
Figure 13B:
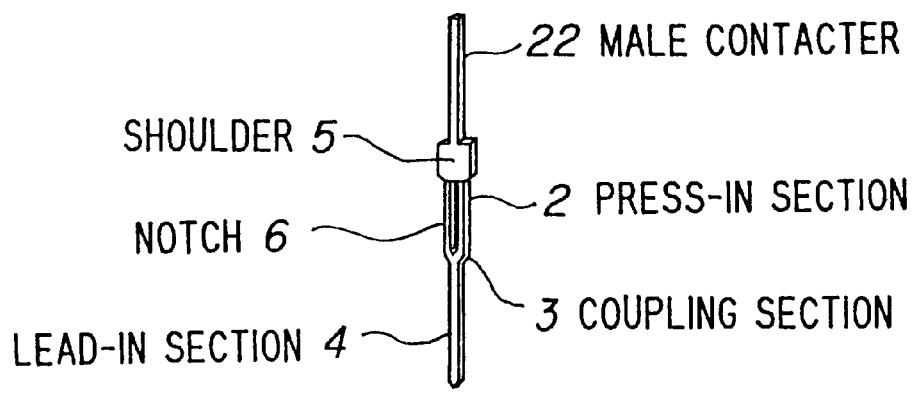

FIGS. 13A–13B are perspective drawings, which respectively show a male connector and a male press-in terminal. As shown in these drawings as the first examples, the male connector catches and holds the plural male press-in terminals 21. The male press-in terminal 21 used in this male connector is composed of a press-in section 2, a coupling section 3, a lead-in section 4 connected to the coupling section 3, a shoulder 5 and a male contactor 22, similarly to the aforementioned terminals 1, wherein a V-notch 6 is stamped on the press-in section 2 and the coupling section 3.

Figure 14A:
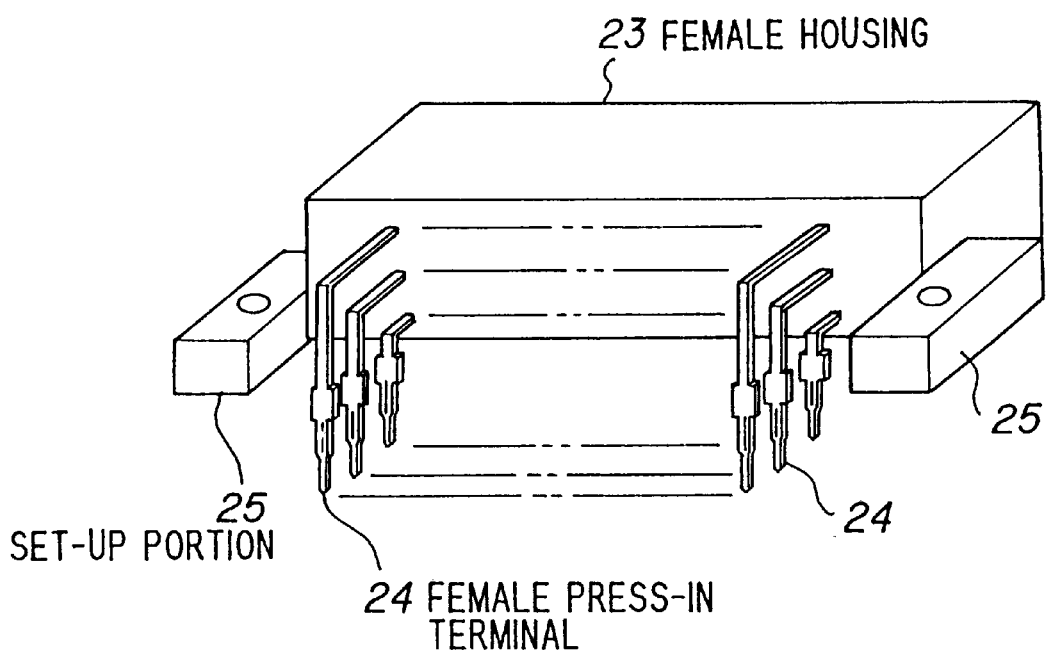
FIGS. 14A–14B show perspective views, which respectively show a female connector and a female press-in terminal used therein.
Figure 14B:
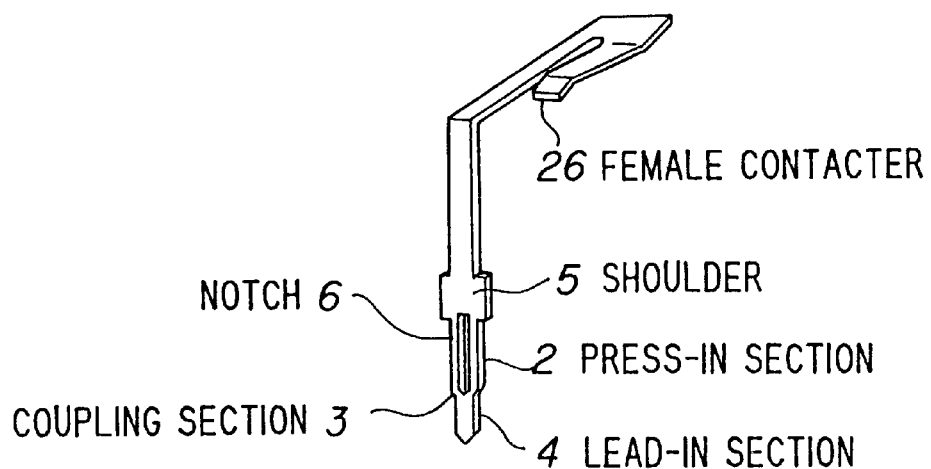

FIGS. 14A–14B are perspective drawings, which respectively show a female connector using female press-in terminals according to the invention and the female press-in terminal. As shown in FIGS. 14A–14B as the second examples, the female connector catches and holds plural female press-in terminals 24s in a female housing 23. The female press-in terminal 24 used in this female connector is composed of a press-in section 2, a coupling-section 3, a lead-in section 4 connected to the coupling section 3, a shoulder 5 and a female contactor 26, wherein a V-notch 6 is stamped on the press-in section 2 and the coupling section 3. In the case of such a female connector, plural holes (not shown) are so made on the front surface of said connector so that the male contacters can be inserted, and set-up portions 25 are provided on both sides of the female connector in order to fix it to a circuit board. Moreover, in order to make the female connector be fit for the male connector in parallel, the female contactor 26 of the female press-in terminal 24 is bent at a right angle.

The aforementioned male and female connectors are collectively pressed into a printed circuit board by pressing the shoulders using jigs which are so designed that jigs do not touch leading portions of terminals and male connectors 22s.

As described in the above, the press-in terminal according to the invention is pressed into a through-hole of a printed circuit board, and electrically contacts with the metallic plating of the through-hole. The press-in section is the most important part of the press-in terminal, and has a trapezoidal cross section, where the width of an upper surface with a V-notch is longer than that of a lower surface, and the press-in section is bent into a V-shape about its middle point. Owing to such a structure, the press-in terminal, which can be held by a through-hole and especially by a through-hole with a smaller inner diameter, by using over all the cross-sectional area of the press-in section, and has a satisfactory compliance, can be easily produced. Moreover, in the press-in terminal according to the invention, since the press-in section can be easily stamped on any position of the press-in terminal in a later step of the manufacturing process, the compliance of the press-in section can be easily guaranteed only by adjusting the depth of the notch, and maintenance of the stamping machine can be easily performed.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A compliant electrical connector for press-fit connection in a through-hole in a printed circuit board having a metallic plating on an inner surface of said through-hole, said connector being formed at least in part from a conducting plate and comprising:

a press-in section having a V or U-shaped notch in a direction perpendicular to a surface of said conducting plate, a first surface with said notch having a width which is larger than that of a second surface which is opposite to said first surface, and wherein said press-in section has a uniformly substantially trapezoidal transverse cross-section;

a lead-in section, a diagonal dimension of which is smaller than an inner diameter of said through-hole;

a coupling section, which has said V or U-shaped notch and a diagonal dimension which gradually increases from said lead-in section to said press-in section, and also having a surface which is smooth, wherein said coupling section also has a uniformly substantially trapezoidal transverse cross-section having corner portions adjacent said first and second surfaces, said corner portions being in contact with said metallic plating; and a shoulder, which is in a region higher than said press-in section and has a larger width as compared with that of said press-in section.

2. A connector according to claim 1, wherein:
said diagonal dimension of said press-in section is larger than an inner diameter of said through-hole.

3. A connector according to claim 1, wherein:
a width of said press-in section is larger than an inner diameter of said through-hole.

4. A connector according to claim 1, wherein:
corners at both ends of said second surface are chamfered or rounded off on said press-in and coupling sections.

5. A connector according to claim 1, wherein:
corners at both ends of said first and second surfaces are chamfered or rounded off on said press-in and coupling sections.

6. A connector according to claim 1, wherein:
said coupling section is pre-formed in V or U-shaped notch in the same bending direction as that of said press-in section.

7. A connector according to claim 1, wherein:
said press-in terminal section has a shallow V or U-shaped notch at a position on said second surface opposite to said V or U-shaped notch on said first surface.

8. A connector according to claim 1, wherein:
said conducting plate is made of electrically conducting plastic material.

9. A connector according to claim 1, wherein:
said conducting plate is made of insulating plastic material plated with metal.

10. A connector according to claim 1, wherein
said coupling section also has a uniformly substantially trapezoidal transverse cross-section.

11. A connector according to claim 1, wherein
said lead-in section has a uniformly substantially rectangular cross-section.

* * * * *